US008221146B2

(12) United States Patent
Duesterhoeft et al.

(10) Patent No.: US 8,221,146 B2
(45) Date of Patent: Jul. 17, 2012

(54) LINEARLY ACTUATED CONNECTOR MATING INTERFACE

(75) Inventors: Scott Stephen Duesterhoeft, Etters, PA (US); Richard Elof Hamner, Hummelstown, PA (US); Robert Neil Mulfinger, York Haven, PA (US); Jason M'Cheyne Reisinger, Carlisle, PA (US); Attalee Snarr Taylor, Palmyra, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 97 days.

(21) Appl. No.: 12/685,398

(22) Filed: Jan. 11, 2010

(65) Prior Publication Data

US 2011/0171848 A1    Jul. 14, 2011

(51) Int. Cl.
  *H01R 13/15*    (2006.01)
(52) U.S. Cl. .............................. 439/260; 439/65; 439/67
(58) Field of Classification Search .................. 439/260, 439/61, 65, 67
  See application file for complete search history.

(56) References Cited

U.S. PATENT DOCUMENTS

| 4,085,990 | A |   | 4/1978  | Jayne |
| 4,518,210 | A |   | 5/1985  | Morrison |
| 4,603,928 | A |   | 8/1986  | Evans |
| 4,626,056 | A |   | 12/1986 | Andrews, Jr. et al. |
| 4,629,270 | A |   | 12/1986 | Andrews, Jr. et al. |
| 4,705,338 | A | * | 11/1987 | Sitzler ........................... 439/260 |
| 4,731,698 | A |   | 3/1988  | Millot et al. |
| 4,840,569 | A |   | 6/1989  | Cabourne |
| 4,846,713 | A | * | 7/1989  | Matsuoka ...................... 439/260 |
| 5,092,781 | A |   | 3/1992  | Casciotti et al. |
| 5,102,342 | A |   | 4/1992  | Marian |
| 5,171,154 | A |   | 12/1992 | Casciotti et al. |
| 5,228,863 | A |   | 7/1993  | Campbell et al. |
| 5,772,451 | A |   | 6/1998  | Dozier, II et al. |
| 6,062,872 | A |   | 5/2000  | Strange et al. |
| 6,077,090 | A |   | 6/2000  | Campbell et al. |
| 6,411,517 | B1 |  | 6/2002  | Babin |
| 6,672,878 | B2 |  | 1/2004  | Dean |
| 6,945,788 | B2 |  | 9/2005  | Trout et al. |
| 6,979,216 | B2 | * | 12/2005 | Maeda et al. ................. 439/260 |
| 7,044,746 | B2 |  | 5/2006  | Copper et al. |
| 7,114,961 | B2 |  | 10/2006 | Williams |
| 7,297,015 | B1 |  | 11/2007 | Desrosiers et al. |
| 7,374,441 | B2 |  | 5/2008  | Rubenstein |
| 7,419,400 | B1 |  | 9/2008  | Taylor et al. |
| 7,425,134 | B1 |  | 9/2008  | Taylor |
| 7,438,582 | B2 |  | 10/2008 | Taylor |
| 7,658,630 | B2 | * | 2/2010  | Tipley et al. .................. 439/260 |
| 7,789,669 | B1 | * | 9/2010  | Duesterhoeft et al. .......... 439/65 |
| 2007/0097662 | A1 | | 5/2007  | Dean |
| 2008/0227314 | A1 | | 9/2008  | Taylor |

* cited by examiner

OTHER PUBLICATIONS

Neoconix PCBeam™ Interposer Design Guide, Neoconix, Rev. 070925, 4 pgs.

*Primary Examiner* — Hien Vu

(57) ABSTRACT

A connector assembly includes a housing, a connector interface, and an actuator. The housing extends from a front end to a back end and includes an elongated channel extending through the housing along an actuation axis disposed between the front and back ends. The connector interface is joined with the front end of the housing and is configured to be electrically joined with a circuit board when the connector interface is moved away from the front end and mates with the circuit board. The actuator is disposed within the channel of the housing and includes a ramp angled toward the front end of the housing. The connector interface mates with the circuit board by moving the actuator along the actuation axis to engage the ramp with the connector interface and move the connector interface toward the circuit board.

20 Claims, 6 Drawing Sheets

LINEARLY ACTUATED CONNECTOR MATING INTERFACE

BACKGROUND OF THE INVENTION

The subject matter herein relates generally to electrical connectors and, more particularly, to electrical connectors that electrically couple circuit boards with one another.

Blade server systems may include several blade server circuit boards that are mounted to a backplane board. In some known blade server systems, the blade server circuit boards are loaded into a server box in a parallel relationship. For example, the blade server circuit boards are loaded into the server box through a front face of the box so that the blade server circuit boards are approximately parallel with respect to one another. A backplane board may be provided in the server box and may engage the blade server circuit boards when the circuit boards are loaded into the box.

Connectors may be mounted to the backplane board to mate with the blade server circuit boards and electrically couple the backplane board with the blade server circuit boards. The connectors may be disposed along a back side of the box that opposes the front face of the box such that the blade server circuit boards are loaded into the housing in an insertion direction that is the same direction in which the blade server circuit boards are moved to mate with the backplane board. The backplane may impede the flow of air through the box from the front face to the back side of the box. For example, the backplane may block air that passes through the box along the insertion direction. Blocking this air may prevent the blade server circuit boards and electrical components mounted thereto from adequately cooling during operation.

Some known server systems include a motherboard located along a bottom side of the box. The motherboard includes connectors that mate with the blade server circuit boards such that the motherboard and blade circuit server boards are oriented perpendicular to one another. These connectors mate with the blade server circuit boards in directions that are perpendicular to the loading direction of the blade server circuit boards. But, the known connectors require twisting or rotation of one or more components of the connectors to mate the connectors with the blade server circuit boards. These connectors may be fairly complex and involve several interconnected components working together. If one or more components fail or become misaligned with one or more other components, the connectors may be unable to mate with the blade server circuit boards.

Thus, a need exists for a simpler connector assembly that interconnects two circuit boards disposed in a perpendicular relationship without significantly restricting the airflow through the housing in which the circuit boards are located.

BRIEF DESCRIPTION OF THE INVENTION

In one embodiment, a connector assembly is provided. The connector assembly includes a housing, a connector interface, and an actuator. The housing extends from a front end to a back end and includes an elongated channel extending through the housing along an actuation axis disposed between the front and back ends. The connector interface is joined with the front end of the housing and is configured to be electrically joined with a circuit board when the connector interface is moved away from the front end and mates with the circuit board. The actuator is disposed within the channel of the housing and includes a ramp angled away from the front end of the housing. The connector interface mates with the circuit board by moving the actuator along the actuation axis to engage the ramp with the connector interface and move the connector interface toward the circuit board.

In another embodiment, another connector assembly is provided. The connector assembly includes a housing, a connector interface, an actuator, and a bearing. The housing includes a channel that extends through the housing along an actuation axis. The connector interface is joined with the housing. The connector interface is configured to be electrically coupled with a circuit board when the connector interface is moved away from the housing. The actuator is disposed within the channel of the housing and is moveable along the actuation axis relative to the housing. The actuator includes a ramp that is angled toward the connector interface. The bearing is disposed between the actuator and the connector interface. The bearing rotates along the ramp of the actuator when the actuator moves along the actuation axis. The bearing engages the connector interface such that rotation of the bearing along the ramp moves the connector interface away from the housing.

DETAILED DESCRIPTION OF THE INVENTION

Figure 1:
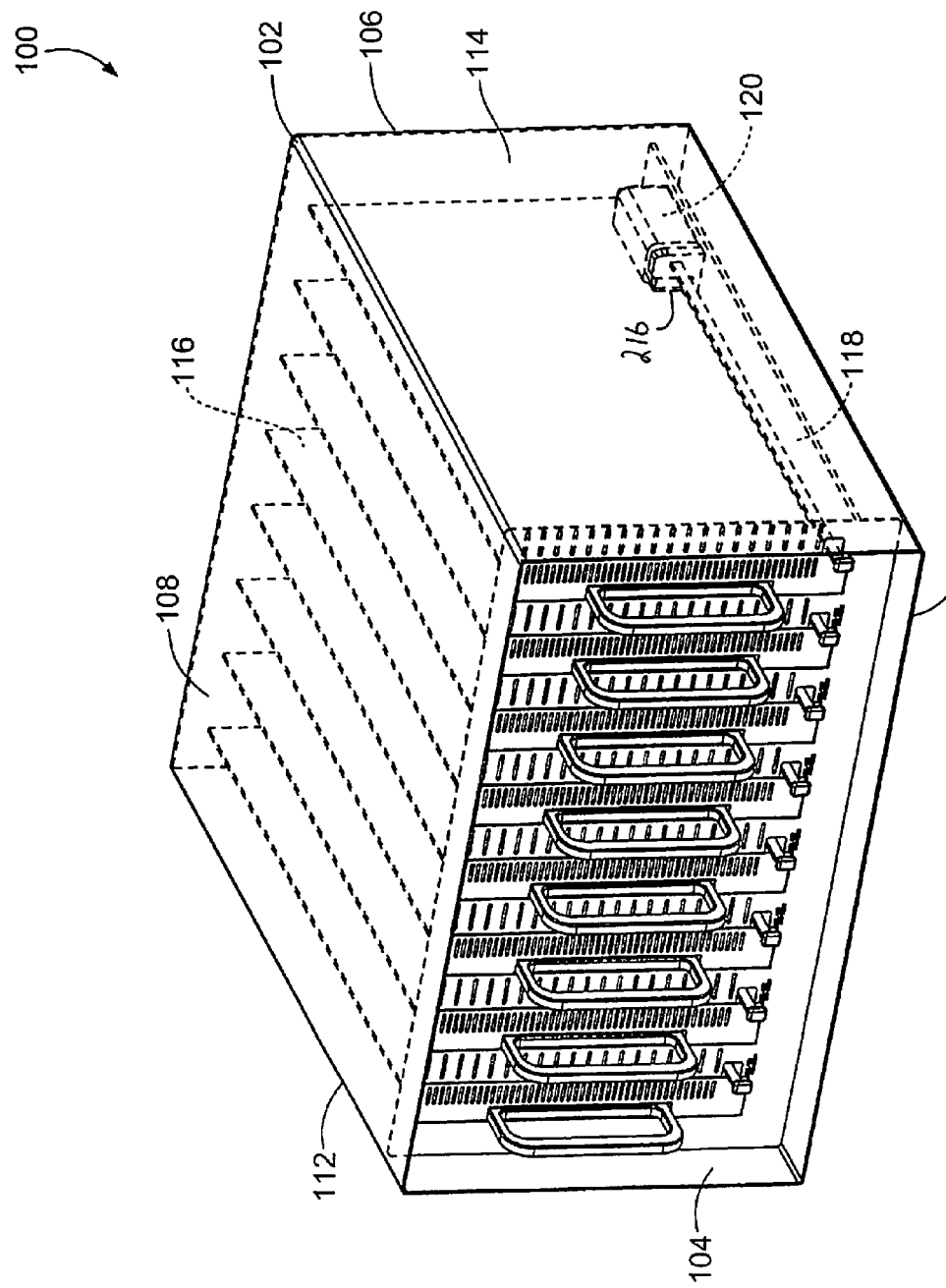
FIG. 1 is a perspective view of a blade server system in accordance with one embodiment of the present disclosure.

FIG. 1 is a perspective view of a blade server system 100 in accordance with one embodiment of the present disclosure. While the description provided herein focuses on a blade server system, the embodiments described herein may be used in one or more other types of systems, such as rack-mount server systems, other non-server based systems, other connector systems that mate with circuit boards, and connector systems that mate with connectors other than circuit boards. The blade server system 100 includes a housing 102 that has opposite front and back faces 104, 106, opposite top and bottom faces 108, 110, and opposite side faces 112, 114. The housing 102 has a shape of a right rectangular prism, or a rectangular cuboid. For example, the opposite faces 104/106, 108/110, and 112/114 of the housing 102 are approximately equal in size and the angles between intersecting faces are perpendicular, or at least approximately perpendicular. Alternatively, the housing 102 may have a different shape.

Several removable circuit boards 116 may be loaded into and removed from the housing 102 through the front face 104. For example, the front face 104 may include one or more openings 824 (shown in FIG. 8) through which the circuit boards 116 may be inserted and removed from the housing 102. In the illustrated embodiment, the removable circuit boards 116 are blade server boards held in a parallel relationship with respect to one another. The removable circuit boards 116 are capable of being loaded into and removed from the housing 102 multiple times without damaging or otherwise deconstructing the system 100. Each of the removable circuit boards 116 may be a printed circuit board having one or more electronic components (not shown) mounted thereon. The electronic components may include, by way of example only, hard drives, power supplies, network connectors, input/output devices and connectors, integrated circuits and processors, and the like.

A circuit board, or motherboard, 118 is disposed within the housing 102 in a location proximate to the bottom face 110. For example, the motherboard 118 may be located in the housing 102 in a position that is approximately parallel to the bottom face 110 and that is closer to the bottom face 110 than the top face 108. In the illustrated embodiment, the motherboard 118 is disposed in a non-parallel relationship with respect to the removable circuit boards 116. For example, the motherboard 118 may be approximately perpendicular with respect to the removable circuit boards 116.

A connector assembly 120 may be mounted to the motherboard 118. Alternatively, the connector assembly 120 may be mounted to one of the circuit boards 116. The connector assembly 120 is electrically coupled with the motherboard 118 and may mate with one or more of the removable circuit boards 116 to electrically couple the removable circuit boards 116 with the motherboard 118. In one embodiment, a single connector assembly 120 may be mounted to the motherboard 118 for each of the circuit boards 116. Alternatively, several connector assemblies 120 may be mounted to the motherboard 118 for each of the circuit boards 116. In another embodiment, a single connector assembly 120 may be mounted to the motherboard 118 for two or more of the circuit boards 116. Data signals and/or electric power may be communicated between the circuit boards 116 and the motherboard 118 via one or more of the connector assemblies 120. The housing 102 may permit air to flow through the housing 102 from the front face 104 to the back face 106, and vice-versa. The connector assemblies 120 may be mounted to the motherboard 118 or the circuit board 116 to eliminate the need for a backplane circuit board (not shown) that is oriented perpendicular to both the motherboard 118 and the circuit boards 116. Eliminating the backplane circuit board permits air to flow more easily through the housing 102 when compared to housings 102 that include a backplane board.

Figure 2:
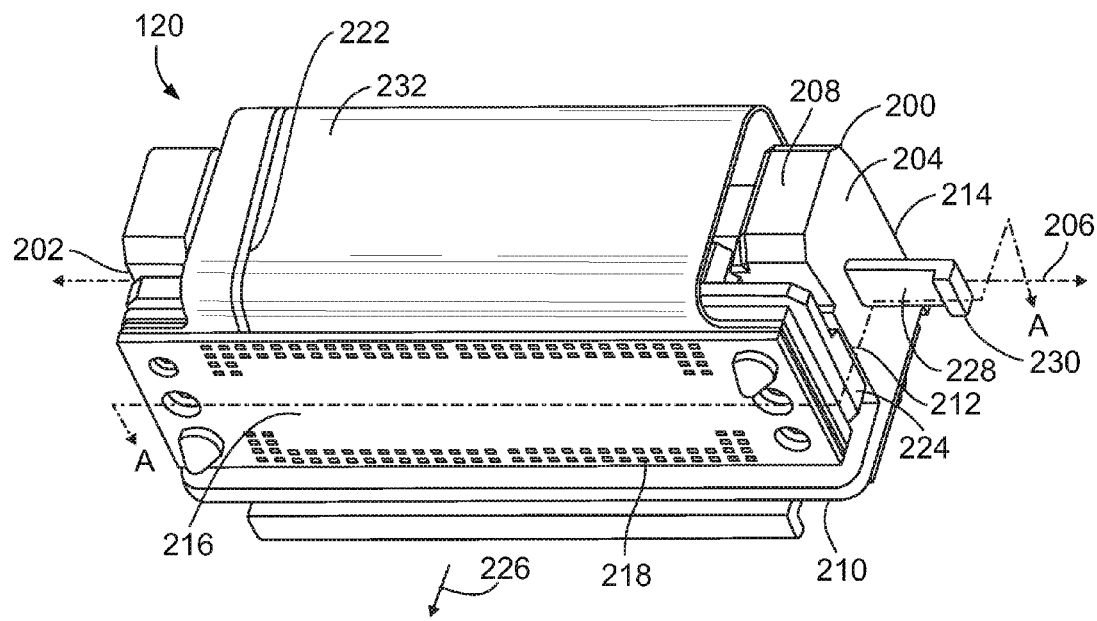
FIG. 2 is a perspective view of a connector assembly shown in FIG. 1 in accordance with one embodiment of the present disclosure.

FIG. 2 is a perspective view of the connector assembly 120 in accordance with one embodiment of the present disclosure. The connector assembly 120 includes a housing 200 that is elongated between opposite sides 202, 204 along an actuation axis 206. The housing 200 includes a top side 208 disposed opposite of a mounting side 210, and a front end 212 oriented opposite of a back end 214. In the illustrated embodiment, the actuation axis 206 is disposed in a region bounded by the top side 208, the mounting side 210, the front end 212 and the back end 214.

A connector interface 216 is joined with the front end 212 of the housing 200. The connector interface 216 shown in FIG. 2 is an approximately planar body with several contacts 218 disposed thereon. The contacts 218 mate with contacts (not shown) on the removable circuit board 116 (shown in FIG. 1) with which the connector assembly 120 mates. The mounting side 210 of the housing 200 may include contacts (not shown) that are electrically coupled with the motherboard 118 (shown in FIG. 1) when the connector assembly 120 is mounted to the motherboard 118. The contacts on the mounting side 210 are electrically joined with the contacts 218 via a circuit member 232. For example, the circuit member 232 may extend from the front end 212 of the housing 200, across the top side 208 and the back end 214 to the mounting side 210. The circuit member 232 may include conductive traces 222 that electrically couple the contacts 218 with the contacts on the mounting side 210. The mating of the contacts 218 with the circuit board 116 electrically couples the circuit board 116 with the motherboard 118 (shown in FIG. 1).

A bearing housing 224 is located between the connector interface 216 and the front end 212 of the housing 200. The bearing housing 224 moves away from the front end 212 of the housing 200 in a mating direction 226 to move the connector interface 216 away from the housing 200. For example, the bearing housing 224 may be pushed along the mating direction 226 to move the connector interface 216 in the mating direction 226 and cause the connector interface 216 to engage the circuit board 116. The bearing housing 224 may retreat toward the front end 212 of the housing 200 in a direction opposed to the mating direction 226. The bearing housing 224 may move toward the housing 200 to decouple the connector interface 216 from the circuit board 116 to which the connector interface 216 is mated.

An actuator 228 is held in the housing 200 and protrudes from the side 204 in the illustrated embodiment. The actuator 228 may have a handle 230 on one end of the actuator 228. The actuator 228 moves within the housing 200 in opposite directions along the actuation axis 206 relative to the housing 200. The handle 230 may be manually operated by a user to move the handle 230 toward or away from the side 204 of the housing 200 to move the actuator 228 in corresponding directions along the actuation axis 206. In one embodiment, movement of the handle 230 toward the side 204 along the actuation axis 206 causes the actuator 228 to engage the bearing housing 224 and drive the bearing housing 224 and the connector interface 216 in the mating direction 226. Movement of the handle 230 away from the side 204 along the actuation axis 206 causes the actuator 228 to engage the bearing housing 224 in such a way to retreat the bearing housing 224 and connector interface 216 in a direction toward the housing 200. In one embodiment, moving the handle 230 away from the side 204 allows a return member 502 (shown in FIG. 5) in the connector assembly 120 to draw the bearing housing 224 and connector interface 216 back to an open position with the connector interface 216 disengaged from the circuit board 116.

Figure 3:
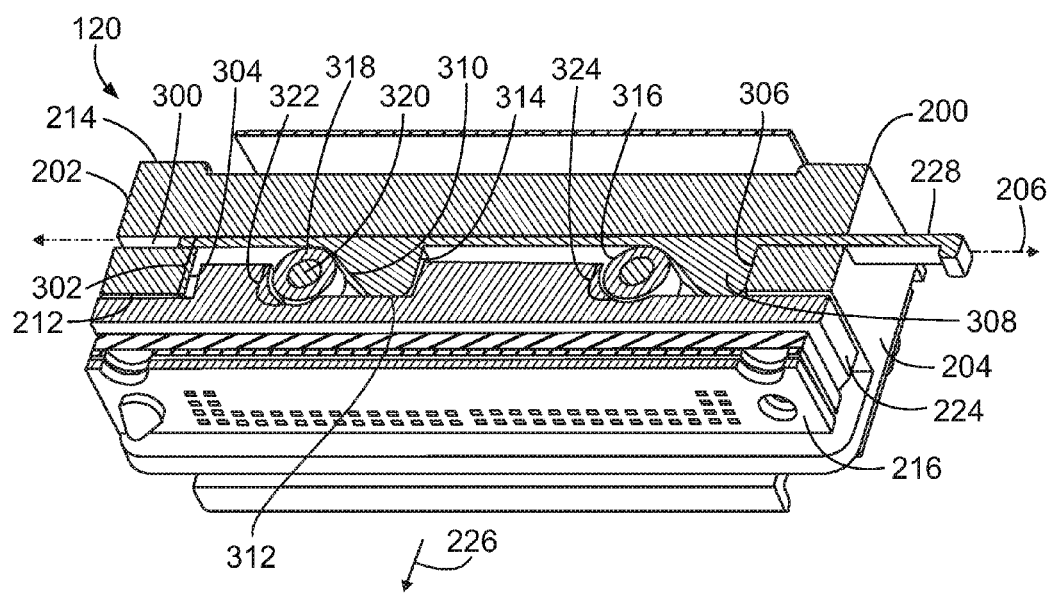
FIG. 3 is a cross-sectional view of the connector assembly shown in FIG. 1 taken along line A-A in FIG. 2 in an open state in accordance with one embodiment of the present disclosure.

FIG. 3 is a cross-sectional view of the connector assembly 120 along line A-A in FIG. 2 in an open state in accordance with one embodiment of the present disclosure. The connector assembly 120 is shown in the open state with the connector interface 216 being drawn inward toward the front end 212 of the housing 200. For example, the connector interface 216 does not project away from the front end 212 to mate with a circuit board 116 (shown in FIG. 1) in the open state shown in FIG. 3.

The housing 200 of the connector assembly 120 includes an elongated channel 300 that is oriented along the actuation axis 206. In the illustrated embodiment, the channel 300 extends through the housing 200 from one side 202 to the other side 204. Alternatively, the channel 300 may extend from the side 204 toward the side 202, but not all the way through the housing 200. The housing 200 includes a recess 302 extending into the housing 200 from the front end 212 toward the back end 214 in a direction oriented opposite to the mating direction 226. The recess 302 extends inward from the front end 212 to the channel 300. The recess 302 extends in directions parallel to the actuation axis 206 between opposing inner surfaces 304, 306. As shown, the inner surfaces 304, 306 are oriented approximately parallel to one another and to the sides 202, 204.

The actuator 228 is disposed within the channel 300 of the housing 200. The actuator 228 includes an elongated shaft that includes ramps 308 angled toward the connector interface 216. The actuator 228 includes two ramps 308 in the illustrated embodiment, but alternatively may include a single ramp 308 or three or more ramps 308. The ramps 308 are angled away from the front end 212 of the housing 200 and toward the connector interface 216. For example, the ramps 308 include exterior angled surfaces 310 that are angled from the actuator 228 toward the connector interface 216 and away from the front end 212 of the housing 200. The angled surfaces 310 are oriented at oblique angles with respect to the actuation axis 206. For example, the angled surface 310 may be oriented at an acute angle with respect to the actuation axis 206.

The actuator 228 also includes exterior resting surfaces 312 that extend from the angled surfaces 310. The resting surface 312 may be an approximately planar surface that is oriented approximately parallel to the actuation axis 206. In another embodiment, the resting surface 312 may include an arcuate surface that is recessed inward in a direction that opposes the mating direction 226. As shown, the angled surface 310 intersects the resting surface 312 and extends between the actuator 228 and the resting surface 312. In the illustrated embodiment, the angled surfaces 310 are angled away from the actuation axis 206 in a direction that extends from the side 202 to the side 204 of the housing 200. For example, the end of each angled surface 310 that is closer to the side 202 is closer to the actuation axis 206 than the opposite end of the angled surface 310 that intersects the resting surface 312. A stopping surface 314 of the actuator 228 intersects the resting surface 312 and extends from the resting surface 312 to the actuator 228. The stopping surface 314 may be oriented approximately perpendicular to the resting surface 312.

The connector assembly 120 includes bearings 316 disposed between the housing 200 and the bearing housing 224. For example, the bearing housing 224 may include a first recess 322 that defines a recess extending into the bearing housing 224 in a direction parallel to the mating direction 226. The first recess 322 is a recess extending into the bearing housing 224 away from the housing 200. One or more of the bearings 316 is disposed within the first recess 322 between the bearing housing 224 and the housing 200. The first recess 322 confines the bearing 316 between the bearing housing 224 and the housing 200 to prevent the bearing 316 from moving outside of the first recess 322 between the bearing housing 224 and the housing 200.

The bearing housing 224 may include a second recess 324 that extends into the bearing housing 224 in a direction parallel to the mating direction 226. The second recess 324 extends into the bearing housing 224 away from the housing 200. One or more of the bearings 316 is disposed within the second recess 324 between the bearing housing 224 and the housing 200. The bearing 316 in the second recess 324 is confined to an area within the second recess 324 that is bounded on one side by the inner surface 306 of the housing 200.

The bearings 316 are rotatably coupled with the connector assembly 120 such that the bearings 316 may rotate relative to the housing 200. In the illustrated embodiment, the bearings 316 include tubular bodies 318 mounted to the bearing housing 224 and rotatably joined with posts 320. The posts 320 may be fixed to the bearing housing 224 such that the posts 320 do not move relative to the bearing housing 224. The tubular bodies 318 rotate around the posts 320 between the housing 200 and the bearing housing 224. For example, the posts 320 may remain stationary with respect to the bearing housing 224 while the tubular bodies 318 rotate relative to the housing 200 and the bearing housing 224. Alternatively, the bearings 316 may be spherical bodies, such as ball bearings, that rotate relative to the housing 200 between the housing 200 and the bearing housing 224. As described below, movement of the actuator 228 along the actuation axis 206 rotates the bearings 316 relative to the actuator 228 and moves the bearings 316 along the angled surfaces 310 away from the front end 212 of the housing 200. The movement of the bearings 316 along the angled surfaces 310 moves the connector interface 216 toward or away from the front end 212 of the housing 200.

Figure 4:
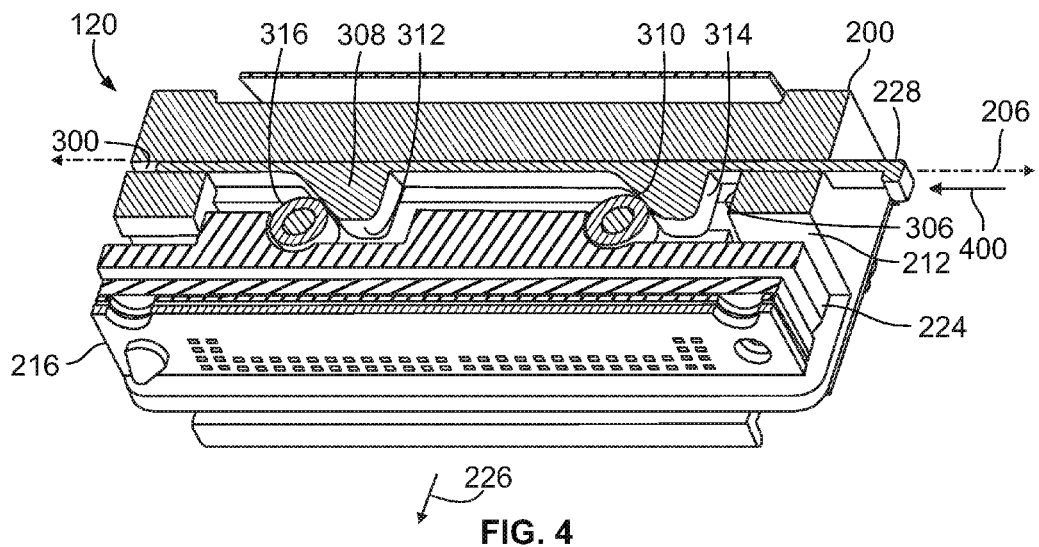
FIG. 4 is a cross-sectional view of the connector assembly shown in FIG. 1 taken along line A-A in FIG. 2 in a partially advanced state in accordance with one embodiment of the present disclosure.

FIG. 4 is a cross-sectional view of the connector assembly 120 along line A-A in FIG. 2 in a partially advanced state in accordance with one embodiment of the present disclosure. The connector assembly 120 is shown in the partially advanced state with the connector interface 216 being partially separated from the front end 212 of the housing 200. For example, the connector interface 216 is separated from the front end 212 of the housing 200 by a distance that is greater than any separation distance between the connector interface 216 and the housing 200 in the open state shown in FIG. 3, but by a distance that may be insufficient to mate the connector interface 216 with a circuit board 116 (shown in FIG. 1).

In order to move the connector interface 216 in the mating direction 226 to couple the connector interface 216 with a circuit board 116, the actuator 228 is moved in an advancing direction 400 along the actuation axis 206. The actuator 228 may be moved in the advancing direction 400 by manually pushing the actuator 228 along the actuation axis 206 such that the actuator 228 slides within the channel 300 of the housing 200. The actuator 228 moves within the channel 300 relative to the housing 200, the bearing housing 224, and the bearings 316. For example, in the open state shown in FIG. 3, the stopping surface 314 of one of the ramps 308 abuts the inner surface 306 of the housing 200. In the partially advanced state shown in FIG. 4, the actuator 228 has been laterally moved within the housing 200 in the advancing direction 400 such that the stopping surface 314 of the ramp 308 is separated from the inner surface 306 of the housing 200.

The bearings 316 may rotate along the actuator 228 as the actuator 228 moves along the advancing direction 400. The bearings 316 engage the ramps 308 and may rotate along the angled surfaces 310 of the ramps 308. For example, as the actuator 228 is moved in the advancing direction 400, the bearings 316 may roll up along the angled surfaces 310. As the bearings 316 roll along the angled surfaces 310, the bearings 316 may drive the bearing housing 224 away from the housing 200. For example, the posts 320 may be fixed to the bearing housing 224 such that the bearings 316 may rotate along the ramps 308. The rotation or rolling of the bearings 316 up along the angled surfaces 310 moves the bearings 316 farther from the front end 212 of the housing 200. The movement of the bearing housing 224 away from the housing 200 advances the connector interface 216 away from the housing 200 in the mating direction 226.

In another embodiment, the ramps 308 may be oriented in a different direction. For example, the angled surfaces 310 of the ramps 308 may be flipped such that the resting surface 312 is located closer to the side 202 than the side 204 of the connector assembly 120. In such an embodiment, the actuator 228 may be pulled along the actuation axis 206 in a direction that is opposite to the advancing direction 400 to move the connector interface 216 away from the housing 200.

Figure 5:
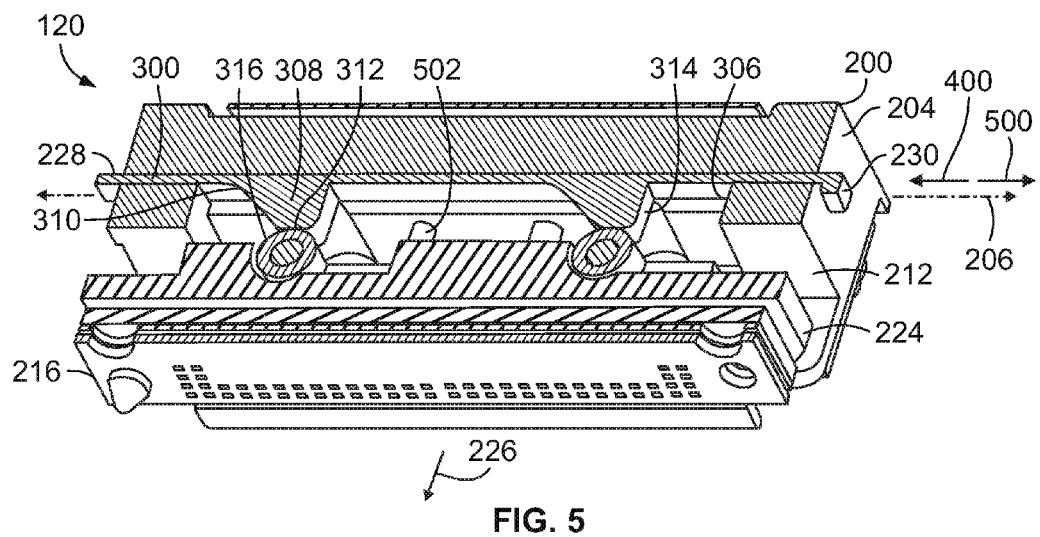
FIG. 5 is a cross-sectional view of the connector assembly shown in FIG. 1 taken along line A-A in FIG. 2 in a closed state in accordance with one embodiment of the present disclosure.

FIG. 5 is a cross-sectional view of the connector assembly 120 along line A-A in FIG. 2 in a closed state in accordance with one embodiment of the present disclosure. The connector assembly 120 is shown in the closed state with the connector interface 216 being separated from the front end 212 of the housing 200 by a distance that is greater than the separation distance between the connector interface 216 and the front end 212 in either the open or partially advanced states shown in FIGS. 3 and 4. The separation between the connector interface 216 and the housing 200 in the closed state shown in FIG. 4 may be sufficiently far to mate the connector interface 216 with a circuit board 116 (shown in FIG. 1).

Between the partially advanced and closed states of FIGS. 4 and 5, the actuator 228 is moved farther in the advancing direction 400 along the actuation axis 206 relative to the partially advanced state shown in FIG. 4. The actuator 228 may be moved to the closed state by manually pushing the actuator 228 along the actuation axis 206 until the handle 230 engages the side 204 of the housing 200. As the actuator 228 is moved in the advancing direction 400, the bearings 316 roll up the ramps 308. The continued movement of the bearings 316 up the ramps 308 continues to drive the bearing housing 224 and the connector interface 216 in the mating direction 226 away from the front end 212 of the housing 200.

The angle of the ramps 308 may be adjusted to change the mechanical advantage provided by the connector assembly 120 in mating the connector assembly 120 with the circuit board 116. For example, the angle of ramps 308 with respect to the actuation axis 206 may be decreased to require lesser force exerted on the actuator 228 to drive the bearings 316 along the ramps 308. The smaller the angle of the ramps 308, however, the longer distance the actuator 228 may need to be moved to mate the connector assembly 120 with the circuit board 116. Conversely, the angle of the ramps 308 with respect to the actuation axis 206 may be increased to require a greater force exerted on the actuator 228 to drive the bearings 316 along the ramps 308. The greater the angle of the ramps 308, however, the shorter distance the actuator 228 may need to be moved to mate the connector assembly 120 with the circuit board 116.

The bearings 316 may rotate along the angled surfaces 310 to the resting surfaces 312 of the ramps 308. The handle 230 may be positioned on the actuator 228 relative to the angled surfaces 310 and the resting surfaces 312 such that the bearings 316 engage the resting surfaces 312 when the handle 230 is pushed up against the side 204 of the housing 200. The bearings 316 stop advancing the bearing housing 224 and connector interface 216 in the mating direction 226 when the bearings 316 engage the resting surfaces 312. For example, as the resting surfaces 312 may be parallel to the front end 212 of the housing 200, the advancement of the bearings 316 onto the resting surfaces 312 may not further move the connector interface 216 farther from the front end 212. As described above, in an alternative embodiment, the resting surfaces 312 may include a recess or other features that capture the bearings 316 onto the resting surfaces 312 such that the bearings 316 may not roll off of the resting surfaces 312 without manual movement of the actuator 228.

Movement of the actuator 228 in an opening direction 500 may draw the connector interface 216 back toward the front end 212 of the housing 200. As shown, the opening direction 500 may be oriented along the actuation axis 206 and opposite of the advancing direction 400. For example, pulling the actuator 228 along the opening direction 500 within the channel 300 may rotate the bearings 316 down the ramps 308 in a direction opposite that the bearings 316 rotate up the ramps 308. Rotation of the bearings 316 down the ramps 308 moves the bearings 316 and the connector interface 216 toward the front end 212 of the housing 200. The actuator 228 may be pulled in the opening direction 500 until the stopping surface 314 of the ramp 308 engages the inner surface 306 of the housing 200.

In one embodiment, the connector assembly 120 includes return members 502 that pull the connector interface 216 back toward the front end 212 of the housing 200 when the bearings 316 rotate down the ramps 308. The return members 502 may be bodies that extend from the housing 200 to the bearing housing 224 and that impart a force on the bearing housing 224 when the return members 502 are stretched. For example, the return members 502 may be springs that are stretched when the bearings 316 roll up the ramps 308 to drive the connector interface 216 away from the housing 200. The return members 502 may impart a force on the connector interface 216 in a direction that opposes the mating direction 226 when the return members 502 are stretched. When the actuator 228 is pulled in the opening direction 500 to cause the bearings 316 roll down the ramps 308, the return members 502 pull the connector interface 216 back toward the front end 212 of the housing 200 to withdraw the connector interface 216 away from the circuit board 116 to which the connector interface 216 was mated.

Figure 6:
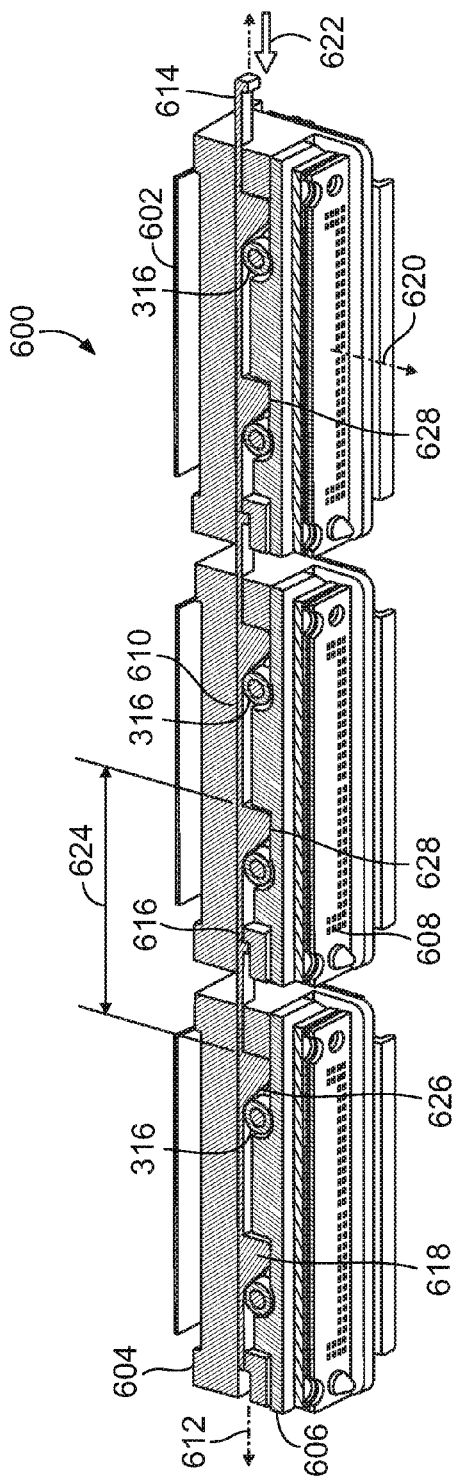
FIG. 6 is a cross-sectional view of a connector system in accordance with one embodiment of the present disclosure.

FIG. 6 is a cross-sectional view of a connector system 600 in accordance with one embodiment of the present disclosure. The cross-sectional view of the system 600 is similar to the cross-sectional view of the connector assembly 120 shown in FIG. 3. The connector system 600 includes several connector assemblies 602 disposed in series with one another. Each of the connector assemblies 602 may be similar to the connector assembly 120. For example, the connector assemblies 602 may include respective housings 604, bearing housings 606, connector interfaces 608, and bearings 610 that are similar to the housing 200 (shown in FIG. 2), the bearing housing 224 (shown in FIG. 2), the connector interface 216 (shown in FIG. 2), and the bearings 316 (shown in FIG. 3). The connector assemblies 602 may be mounted to a single motherboard such as the motherboard 118 (shown in FIG. 1) to mate with one or more of the circuit boards 116 (shown in FIG. 1).

The connector assemblies 602 are joined in series with one another such that the connector assemblies 602 are disposed end-to-end along an actuation axis 612. For example, the connector assemblies 602 are elongated in approximately the same direction along the actuation axis 612. The connector system 600 includes an actuator 614 that extends through the connector assemblies 602 in a manner that may be similar to the actuator 228 (shown in FIG. 2) extending through the connector assembly 120 (shown in FIG. 2). For example, the housings 604 may include elongated channels 616 that are similar to the channel 300 (shown in FIG. 3). The actuator 614 may be a single, unitary, and elongated body that extends through the channels 616 of the connector assemblies 602. Alternatively, the actuator 614 may include several individual actuators that are coupled end-to-end with one another.

The actuator 614 includes several ramps 618 disposed between the housing 604 and the connector interface 608 of each connector assembly 602. In the illustrated embodiment, the actuator 614 includes two ramps 618 located between the housing 604 and the connector interface 608 of each connector assembly 602. Each of the ramps 618 intersects a resting surface 628. The actuator 614 is moved along the actuation axis 612 to simultaneously or concurrently move the connector interfaces 608 away from the housings 604 in mating direction 620. For example, the actuator 614 may be moved in an advancing direction 622 along the actuation axis 612 to rotate the bearings 610 up along the ramps 618 to drive the connector interfaces 608 and bearing housings 606 away from the housings 604 at approximately the same time.

Alternatively, the ramps 618 may be spaced along the length of the actuator 614 such that movement of the actuator 614 in the advancing direction 622 sequentially drives the connector interfaces 608 away from the housings 604. A pitch 624 between adjacent ramps 618 along the length of the actuator 614 may be varied along the length of the actuator 614 to cause the connector interface 608 of one connector assembly 602 to move away from the housing 604 before one or more other connector interfaces 608. The pitch 624 represents a distance measured along the actuation axis 612 that extends between the same or similar features of adjacent ramps 618. By way of example only, the pitch 624 between consecutive ramps 618 disposed within one pair connector assemblies 602 may be greater than the pitch 624 between consecutive ramps 618 disposed within a different pair of connector assemblies 602. The different pitch 624 among the ramps 618 may cause the connector interface 608 of one assembly 602 to move away from the housing 604 before the connector interface 608 of another assembly 602 when the actuator 614 is moved along the actuation axis 612. Depending on the location of the ramps 618, the size of the resting surfaces 628 may be lengthened or shortened for the ramps 618 of one or more of the connector assemblies 602. For example, the resting surfaces 628 of one connector assembly 602 may be longer than the resting surfaces 628 of another connector assembly 602 such that the bearings 316 may roll along the longer resting surfaces 628 over a greater distance than along the shorter resting surfaces 628.

Figure 7:
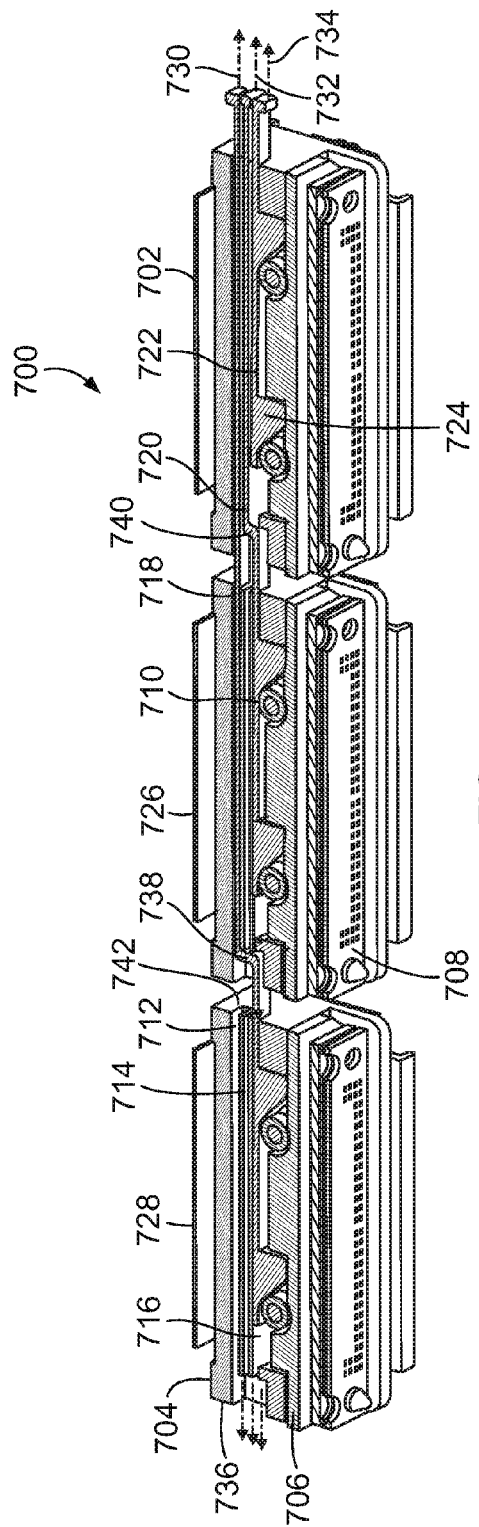
FIG. 7 is a cross-sectional view of a connector system in accordance with another embodiment of the present disclosure.

FIG. 7 is a cross-sectional view of a connector system 700 in accordance with another embodiment of the present disclosure. The connector system 700 may be similar to the connector system 600 (shown in FIG. 6). For example, the connector system 700 may include several connector assemblies 702, 726, 728 joined in series with one another. Each of the connector assemblies 702, 726, 728 may be similar to the connector assembly 120 (shown in FIG. 1). For example, the connector assemblies 702, 726, 728 may include respective housings 704, bearing housings 706, connector interfaces 708, and bearings 710 that are approximately similar to the housing 200 (shown in FIG. 2), the bearing housing 224 (shown in FIG. 2), the connector interface 216 (shown in FIG. 2), and the bearings 316 (shown in FIG. 3). The connector assemblies 702, 726, 728 may be mounted to a single motherboard such as the motherboard 118 (shown in FIG. 1) to mate with one or more of the circuit boards 116 (shown in FIG. 1).

The housings 704 of the connector assemblies 702, 726, 728 include multiple channels 712-716. For example, in contrast to the housings 200 (shown in FIG. 3), 604 (shown in FIG. 6), the housings 704 may include multiple elongated channels 712, 714, 716 extending through the housings 704. The channels 712-716 are oriented along respective actuation axes 730, 732, 734. The channels 712-716 may extend through the respective housings 704 between opposite sides 736, 742 of each housing 704. In the illustrated embodiment, the actuation axes 730-734 and channels 712-716 are oriented approximately parallel to one another. While three channels 712-716 and actuation axes 730-734 are shown in each housing 704, alternatively a different number of channels 712-716 and/or actuation axes 730-734 may be provided.

The connector system 700 includes several actuators 718, 720, 722 disposed in the channels 712-716. The actuators 718-722 include ramps 724 that are similar to the ramps 308 (shown in FIG. 3), 618 (shown in FIG. 6). For example, the ramps 724 may engage the bearings 710 to move the connector interfaces 708 away from the respective housings 704. Each of the actuators 718-722 moves along a corresponding one of the actuation axes 730-734 to advance a different one of the connector interfaces 708. For example, the actuator 718 may be moved along the actuation axis 730 to move the connector interface 708 away from the respective housing 704 of the connector assembly 728. The actuator 720 may be moved along the actuation axis 732 to advance the connector interface 708 away from the housing 704 of the connector assembly 726. The actuator 722 may be moved along the actuation axis 734 to move the connector interface 708 away from the housing 704 of the connector assembly 702.

The actuators 718-722 may be independently operated to separately move the different connector interfaces 708 away from the corresponding housing 704. For example, the actuator 718 may be moved to move the connector interface 708 away from the housing 704 of the connector assembly 728 while the connector interfaces 708 of the connector assemblies 702, 726 do not move. As another example, two of the actuators 720, 722 may be moved along the actuation axes 732, 734 to move the connector interfaces 708 away from the housings 704 of the connector assemblies 702, 726 while the connector interface 708 of the connector assembly 728 does not move.

The actuators 718-722 protrude from the side 742 of the connector assembly 702 such that an operator may manually move the actuators 718-722 independent of one another from one location. As shown, the actuators 718, 720 have a stair step shape while the actuator 722 has an approximately linear shape similar to the actuator 228 (shown in FIG. 3). For example, the actuator 718 may have a staggered shape in that the actuator 718 linearly extends through the channel 712 in the right most connector assembly 702 and the middle connector assembly 726 but extends through the channel 716 in the left most connector assembly 728. The actuator 718 includes a bridge portion 738 disposed between the connector assemblies 726, 728. The bridge portion 738 is oriented in a direction that is approximately perpendicular to the actuation axes 730-734 to shift the actuator 718 from extending through the channel 712 in the connector assembly 726 to the channel 716 in the connector assembly 728. The actuator 720 includes a bridge portion 740 disposed between the connector assemblies 702, 726. The bridge portion 740 is oriented in a direction approximately parallel to the bridge portion 738. The bridge portion 740 shifts the actuator 720 from extending through the channel 714 in the connector assembly 702 to the channel 716 in the connector assembly 726.

Figure 8:
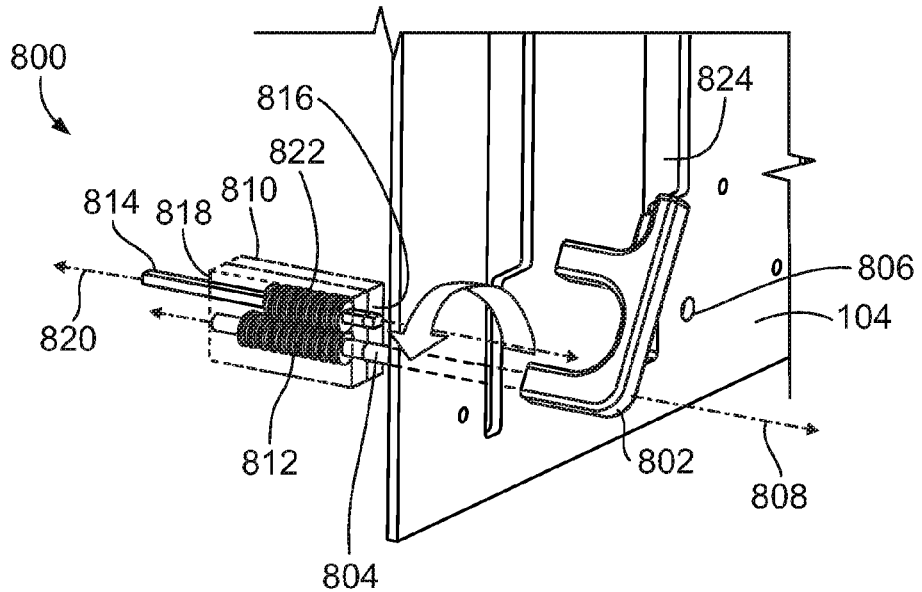
FIG. 8 is a perspective view of a linear actuation device in an open state in accordance with one embodiment of the present disclosure.
Figure 9:
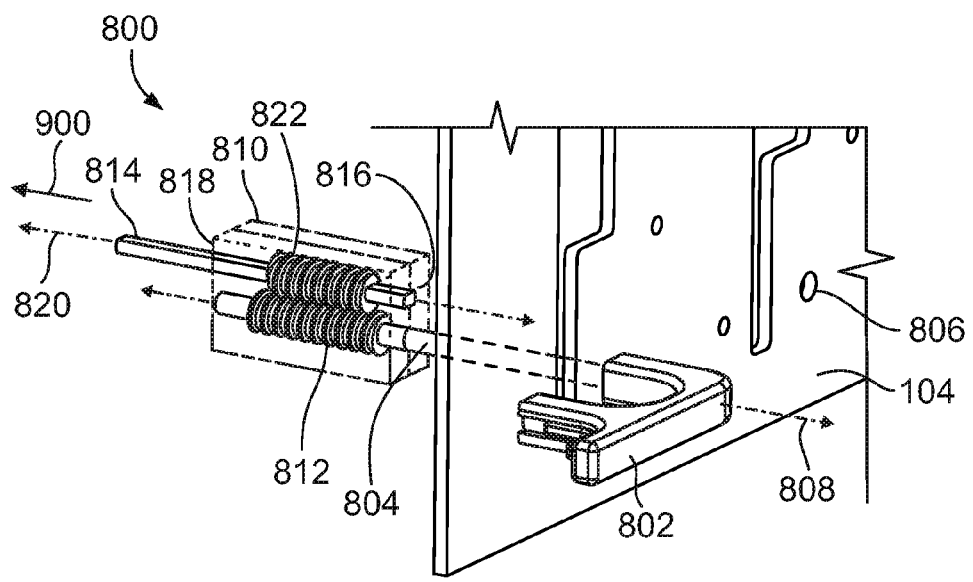
FIG. 9 is a perspective view of the linear actuation device shown in FIG. 8 in closed state in accordance with one embodiment of the present disclosure.

FIG. 8 is a perspective view of a linear actuation device 800 in an open state in accordance with one embodiment of the present disclosure. FIG. 9 is a perspective view of the linear actuation device 800 in a closed state in accordance with one embodiment of the present disclosure. The device 800 may be used to move one or more of the actuators 228 (shown in FIG. 2), 614 (shown in FIG. 6), 718-722 (shown in FIG. 7) along the respective actuation axis 206 (shown in FIG. 2), 612 (shown in FIG. 6), 730-734 (shown in FIG. 7). The device 800 includes a handle 802 that may be rotated to linearly move one or more of the actuators 228, 614, 718-722 along the actuation axes 206, 612, 730-734, as described above.

In the illustrated embodiment, the handle 802 is joined with an elongated shaft 804. The handle 802 may be disposed on the exterior side of the front face 104 of the blade server system 100 (shown in FIG. 1). As shown in FIGS. 8 and 9, the front face 104 includes openings 824 through which the circuit boards 116 (shown in FIG. 1) may be loaded into the system 100 (shown in FIG. 1). The handle 802 may be coupled with the shaft 804 through an opening 806 that extends through the front face 104. Rotation of the handle 802 about a rotation axis 808 that is defined by the shaft 804 also rotates the shaft 804 about the rotation axis 808. The shaft 804 is received within a housing 810. The housing 810 may be a partially enclosed container that receives the shaft 804 through one side 816 of the housing 810. The housing 810 may be mounted to the motherboard 118 (shown in FIG. 1) in the system 100. The portion of the shaft 804 within the housing 810 includes a geared interface 812. In the illustrated embodiment, the geared interface 812 is an external threaded surface.

An actuator 814 is received into the housing 810 through a side 818 that is opposite of the side 816. The actuator 814 may be similar to one or more of the actuators 228 (shown in FIG. 2), 614 (shown in FIG. 6), 718-722 (shown in FIG. 7). For example, the actuator 814 may be elongated along an actuation axis 820. As described above, movement of the actuator 814 along the actuation axis 820 may drive one or more connector interfaces such as the connector interface 216 (shown in FIG. 2), 608 (shown in FIG. 6), 708 (shown in FIG. 7) toward or away from one or more circuit boards 116 (shown in FIG. 1) to mate the connector interface with the circuit boards 116.

The portion of the actuator 814 that is disposed within the housing 810 includes a geared interface 822. In the illustrated embodiment, the geared interface 822 is an external threaded surface. The geared interfaces 812, 822 of the shaft 804 and the actuator 814 engage one another such that rotation of the handle 802 and shaft 804 causes the geared interfaces 812, 822 to mesh with one another and translate the rotation of the shaft 804 into linear motion of the actuator 814 along the actuation axis 820. In the illustrated embodiment, the handle 802 is rotated from the open state shown in FIG. 8 to the closed state shown in FIG. 9 to move the actuator 814 in an advancing direction 900 along the actuation axis 820. Conversely, the handle 802 may be rotated from the closed state to the open state to move the actuator 814 in an opposite direction along the actuation axis 820. As described above, movement of the actuator 814 to and fro along the actuation axis 820 may move one or more connector interfaces such as the connector interface 216 (shown in FIG. 2), 608 (shown in FIG. 6), 708 (shown in FIG. 7) toward or away from one or more circuit boards 116 (shown in FIG. 1) to mate the connector interface with the circuit boards 116.

Figure 10:
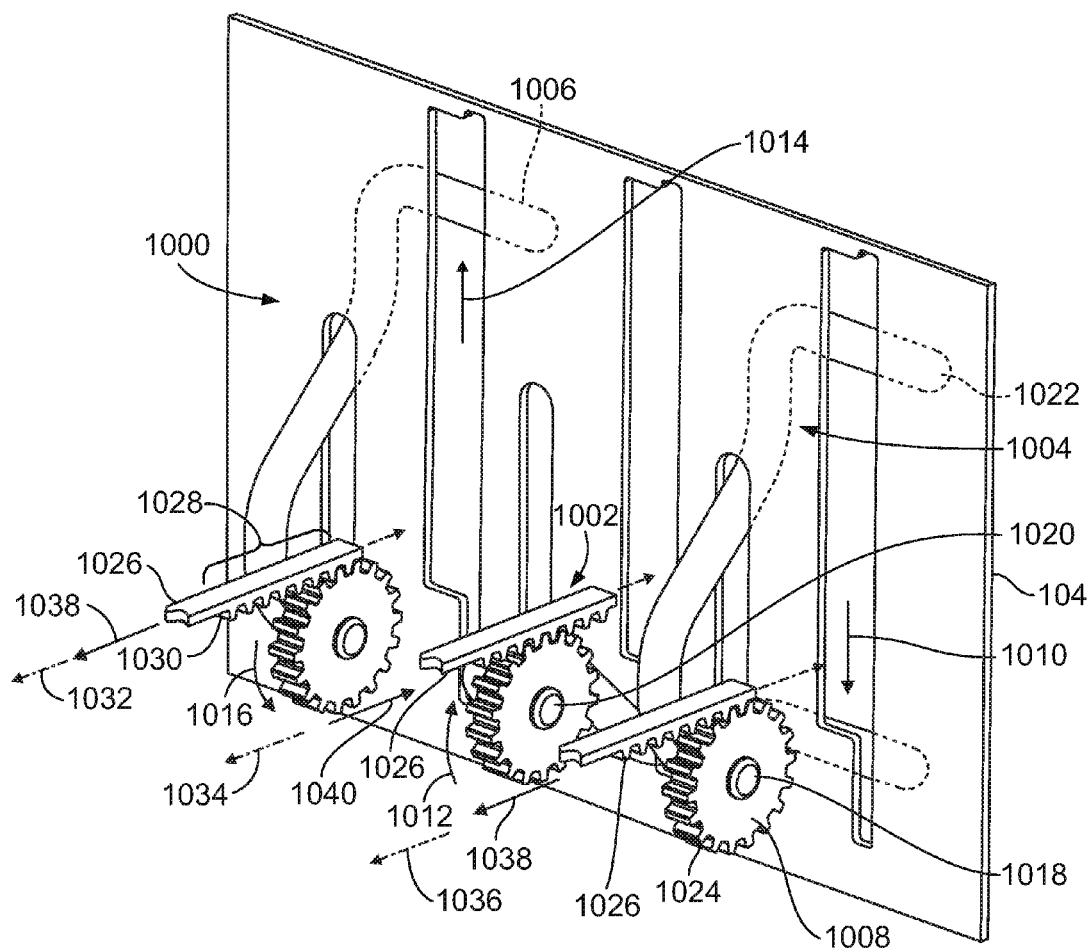
FIG. 10 is a perspective view of linear actuation devices in accordance with another embodiment of the present disclosure.

FIG. 10 is a perspective view of linear actuation devices 1000, 1002, 1004 in accordance with one embodiment of the present disclosure. The devices 1000-1004 may be used to move one or more of the actuators 228 (shown in FIG. 2), 614 (shown in FIG. 6), 718-722 (shown in FIG. 7) along the respective actuation axis 206 (shown in FIG. 2), 612 (shown in FIG. 6), 730-734 (shown in FIG. 7). Each of the devices 1000-1004 includes a handle 1006 that may be rotated to linearly move one or more of the actuators 228, 614, 718-722 along the actuation axes 206, 612, 730-734, as described above.

In the illustrated embodiment, the handles 1006 are joined with gears 1008. The handles 1006 are coupled with the gears 1008 such that the handles 1006 may be moved in a downward direction 1010 to rotate the gears 1008 in an opening direction 1012, or the handles 1006 may be moved in an opposite upward direction 1014 to rotate the gears 1008 in a closing direction 1016. For example, one end 1018 of the handles 1006 may extend into a center opening 1020 of the gears 1008 with an opposite end 1022 of the handles 1006 being moveable by a user in the upward and downward directions 1014, 1010. The ends 1022 of the handles 1006 may be disposed on the exterior side of the front face 104 of the blade server system 100 (shown in FIG. 1).

The gears 1008 include teeth 1024 radially protruding from the outer periphery of the gears 1008. Several actuators 1026 may be provided that each include an outer end 1028 coupled with a corresponding gear 1008. As shown, the outer ends 1028 of the actuators 1026 include teeth 1030 that mesh with, or otherwise engage, the teeth 1024 of the gears 1008. The actuators 1026 may be similar to one or more of the actuators 228 (shown in FIG. 2), 614 (shown in FIG. 6), 718-722 (shown in FIG. 7). For example, the actuators 1026 may be elongated along respective actuation axes 1032, 1034, 1036. As described above, movement of the actuators 1026 along the respective actuation axes 1032-1036 may drive one or more connector interfaces such as the connector interface 216 (shown in FIG. 2), 608 (shown in FIG. 6), 708 (shown in FIG. 7) toward or away from one or more circuit boards 116 (shown in FIG. 1) to mate the connector interface with the circuit boards 116.

The teeth 1024 of the gears 1008 and the teeth 1030 of the actuators 1026 engage one another such that movement of the handles 1006 in the upward or downward directions 1014, 1010 causes the teeth 1024, 1030 to mesh with one another and translate the movement of the handles 1006 into linear motion of the actuator 1026 along a corresponding actuation axis 1032-1036. In the illustrated embodiment, the handle 1006 may be moved in the upward direction 1014 to rotate the corresponding gear 1008 in the closing direction 1016. As the gear 1008 rotates in the closing direction 1016, the gear 1008 drives the actuator 1026 in a linear advancing direction 1038 along the respective actuation axis 1032-1036. Conversely, movement of the handle 1006 in the downward direction 1010 may cause the corresponding gear 1008 to rotate in the opening direction 1012. As the gear 1008 rotates in the opening direction 1012, the gear 1008 pulls the actuator 1026 in a linear retreating direction 1040 along the respective actuation axis 1032-1036. As described above, movement of the actuators 1026 to and fro along the actuation axes 1032-1036 may move one or more connector interfaces such as the connector interface 216 (shown in FIG. 2), 608 (shown in FIG. 6), 708 (shown in FIG. 7) toward or away from one or more circuit boards 116 (shown in FIG. 1) to mate the connector interface with the circuit boards 116.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A connector assembly comprising:
a housing having a mating end and a back end, the housing including an elongated channel extending through the housing along an actuation axis disposed between the mating and back ends;
a connector interface joined with the mating end of the housing, the connector interface configured to be electrically joined with a circuit board when the connector interface is moved away from the mating end and mates with the circuit board; and
an actuator disposed within the channel of the housing, the actuator including a ramp angled toward the connector interface, wherein the connector interface mates with the circuit board by moving the actuator along the actuation axis to engage a rotatable bearing with the ramp so that to move the connector interface toward the circuit board.

2. The connector assembly of claim 1, wherein the actuator is moved in an advancing direction along the actuation axis to move the connector interface away from the mating end of the housing and in an opposite opening direction along the actuation axis to move the connector interface toward the mating end.

3. The connector assembly of claim 1, wherein the rotatable bearing is disposed between the connector interface and the actuator, the bearing rotating along an exterior surface of the ramp and moving the connector interface away from the housing when the actuator is moved along the actuation axis.

4. The connector assembly of claim 1, wherein the rotatable bearing comprises a tubular body rotatably joined with a post.

5. The connector assembly of claim 1, wherein the actuator comprises an elongated body having a handle joined to the body and projecting outside of the housing, the handle configured to be manually moved to translate the actuator along the actuation axis.

6. The connector assembly of claim 1, further comprising a bearing housing disposed between the housing and the connector interface, wherein the rotatable bearing is disposed between the bearing housing and the connector interface, the bearing housing including a slot extending into the bearing housing in a direction extending away from the mating end of the housing, wherein the bearing rotates along the ramp of the actuator within the slot and moves the connector interface toward the circuit board.

7. The connector assembly of claim 1, wherein the housing is a first housing, the connector interface is a first connector interface, and the ramp is a first ramp, further comprising a second housing and a second connector interface joined in series with the first housing and the first connector interface, further wherein the actuator includes a second ramp angled toward the front end of the second housing, the actuator moving along the actuation axis to move the first and second connector interfaces away from the first and second housings.

8. The connector assembly of claim 7, wherein the actuator moves along the actuation axis to simultaneously move the first and second connector interfaces away from the respective first and second housings.

9. The connector assembly of claim 1, wherein the housing is a first housing, the connector interface is a first connector interface, and the actuator is a first actuator, further comprising a second housing and a second connector interface joined in series with the first housing and the first connector interface and a second actuator comprising a second ramp angled toward the second connector interface, further wherein the first and second actuators extend through the channels of the first and second housings and are moveable along the actuation axis to independently move the first and second connector interfaces away from the respective first and second housings.

10. The connector assembly of claim 1, wherein the actuator comprises an elongated body having a geared interface and a handle having a geared interface that engages the geared interface of the actuator, the handle being rotatable to move the actuator along the actuation axis.

11. A connector assembly comprising:
a housing including a channel extending through the housing along an actuation axis;
a connector interface joined with the housing, the connector interface configured to be electrically coupled with a circuit board when the connector interface is moved away from the housing;
an actuator disposed within the channel of the housing and moveable along the actuation axis relative to the housing, the actuator including a ramp angled toward the connector interface; and
a rotatable bearing disposed between the actuator and the connector interface, the bearing rotating along an exterior surface of the ramp when the actuator moves along the actuation axis, wherein the bearing engages a bearing housing that engages the connector interface such that rotation of the bearing along the ramp moves the connector interface away from the housing.

12. The connector assembly of claim 11, wherein the actuator is moved in an advancing direction along the actuation axis to rotate the bearing along the ramp toward the connector interface and move the connector interface away from the housing and in an opposite opening direction along the actuation axis to move the connector interface toward the housing.

13. The connector assembly of claim 11, wherein the actuator is moved in an opening direction along the actuation axis to rotate the bearing along the ramp toward the housing and move the connector interface toward the housing and in an opposite advancing direction along the actuation axis to move the connector interface away from the housing.

14. The connector assembly of claim 11, wherein the bearing is a cylindrical body that rotates relative to the housing to roll along the ramp of the actuator.

15. The connector assembly of claim 11, wherein the actuator comprises an elongated body having a handle joined to a lever and projecting outside of the housing, the handle configured to be manually moved to translate the actuator along the actuation axis.

16. The connector assembly of claim 11, wherein the bearing housing is disposed between the housing and the connector interface with the bearing disposed between the bearing housing and the actuator, the bearing housing including a slot extending into the bearing housing in a direction extending away from the housing, wherein the bearing rotates along the ramp of the actuator within the slot.

17. The connector assembly of claim 11, wherein the housing is a first housing, the connector interface is a first connector interface, the bearing is a first bearing, and the ramp is a first ramp, further comprising a second bearing, a second housing and a second connector interface joined in series with the first housing and the first connector interface, further wherein the actuator includes a second ramp angled toward the front end of the second housing, the actuator moving along the actuation axis to rotate the first and second bearings along the first and second ramps to move the first and second connector interfaces away from the first and second housings.

18. The connector assembly of claim 17, wherein the actuator moves along the actuation axis to simultaneously move the first and second connector interfaces away from the respective first and second housings.

19. The connector assembly of claim 11, wherein the housing is a first housing, the connector interface is a first connector interface, the bearing is a first bearing, and the actuator is a first actuator, further comprising a second housing and a second connector interface joined in series with the first housing and the first connector interface, a second actuator comprising a second ramp angled toward the second connector interface, and a second bearing disposed between the second actuator and the second connector interface, further wherein the first and second actuators extend through the channels of the first and second housings and are moveable along the actuation axis to independently rotate the first and second bearings along the first and second ramps to move the first and second connector interfaces away from the first and second housings.

20. The connector assembly of claim 11, wherein the actuator comprises an elongated body having a geared interface and a handle having a geared interface that engages the geared interface of the actuator, the handle being rotatable to move the actuator along the actuation axis.

* * * * *